(12) United States Patent
Sprague et al.

(10) Patent No.: US 9,194,916 B2
(45) Date of Patent: Nov. 24, 2015

(54) METHOD WITH SYSTEM AND PROGRAM PRODUCT FOR PRIORITIZING CLOCK DOMAINS FOR TESTING OF INTEGRATED CIRCUIT DESIGNS

(71) Applicant: International Business Machines Corporation, Armonk, NY (US)

(72) Inventors: Douglas E. Sprague, Ellsworth, ME (US); Philip S. Stevens, Williston, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 73 days.

(21) Appl. No.: 14/146,056

(22) Filed: Jan. 2, 2014

(65) Prior Publication Data

US 2015/0185286 A1    Jul. 2, 2015

(51) Int. Cl.
  *G01R 31/319* (2006.01)
  *G01R 31/3185* (2006.01)
  *G01R 31/317* (2006.01)
  *G01R 31/3177* (2006.01)

(52) U.S. Cl.
  CPC ...... *G01R 31/31922* (2013.01); *G01R 31/3177* (2013.01); *G01R 31/31725* (2013.01); *G01R 31/318552* (2013.01); *G01R 31/318563* (2013.01)

(58) Field of Classification Search
  CPC .............. G01R 31/318594; G01R 31/3177; G01R 31/318552; G01R 31/31727; G01R 31/31725; G01R 31/318563; G01R 31/31922
  USPC ........................................................ 714/731
  See application file for complete search history.

(56) References Cited

U.S. PATENT DOCUMENTS

| 6,707,313 | B1 | 3/2004 | Rohrbaugh et al. |
| 7,257,756 | B2* | 8/2007 | Wolff et al. ................... 714/744 |
| 7,805,648 | B2 | 9/2010 | Ramachandran |
| 7,945,417 | B2 | 5/2011 | Vohra et al. |
| 7,958,472 | B2* | 6/2011 | Wohl et al. ..................... 716/106 |
| 8,074,133 | B2* | 12/2011 | Ziaja et al. ..................... 714/731 |
| 8,209,141 | B2 | 6/2012 | Bassett et al. |
| 8,381,051 | B2* | 2/2013 | Bahl et al. ...................... 714/731 |
| 8,386,866 | B2* | 2/2013 | Chung ........................... 714/731 |

(Continued)

OTHER PUBLICATIONS

"Method for ATPG for scan designs with multiple clock domains and different scan styles of sequential memory elements", IP.com Prior Art Database Technical Disclosure, IPCOM000010252D, Nov. 13, 2002, 6 pages.

*Primary Examiner* — James C Kerveros
(74) *Attorney, Agent, or Firm* — Michael LeStrange; Hoffman Warnick LLC

(57) ABSTRACT

The present disclosure generally provides for a method of prioritizing clock domains for testing an integrated circuit (IC) design. The method can include: assigning each of a plurality of multi-tested clock domains (MTCDs) and a plurality of test experiments (TEs) to one of a plurality of speed priority groups (SPGs), wherein the assigning includes: creating a new SPG having a priority value of n+1, wherein n represents the number of previously created SPGs; assigning a first MTCD corresponding to at least two of the plurality of TEs, the first MTCD not being previously assigned to an SPG, to the new SPG; and assigning each TE corresponding to the first MTCD, each of the assigned TEs not being previously assigned to an SPG, to the new SPG; and performing each of the plurality of TEs on the IC design in order from lowest priority value to highest priority value.

20 Claims, 5 Drawing Sheets

(56) References Cited

U.S. PATENT DOCUMENTS

| | | |
|---|---|---|
| 8,412,993 B2 | 4/2013 | Song et al. |
| 8,479,068 B2 * | 7/2013 | Periasamy et al. ............ 714/731 |
| 8,862,955 B2 * | 10/2014 | Cesari ........................... 714/731 |
| 2008/0320347 A1 * | 12/2008 | Cussonneau et al. ......... 714/723 |
| 2010/0332932 A1 * | 12/2010 | Muraoka ....................... 714/744 |
| 2011/0301907 A1 | 12/2011 | Kumar et al. |
| 2012/0150473 A1 | 6/2012 | Grise et al. |
| 2012/0173943 A1 | 7/2012 | Cesari |

* cited by examiner

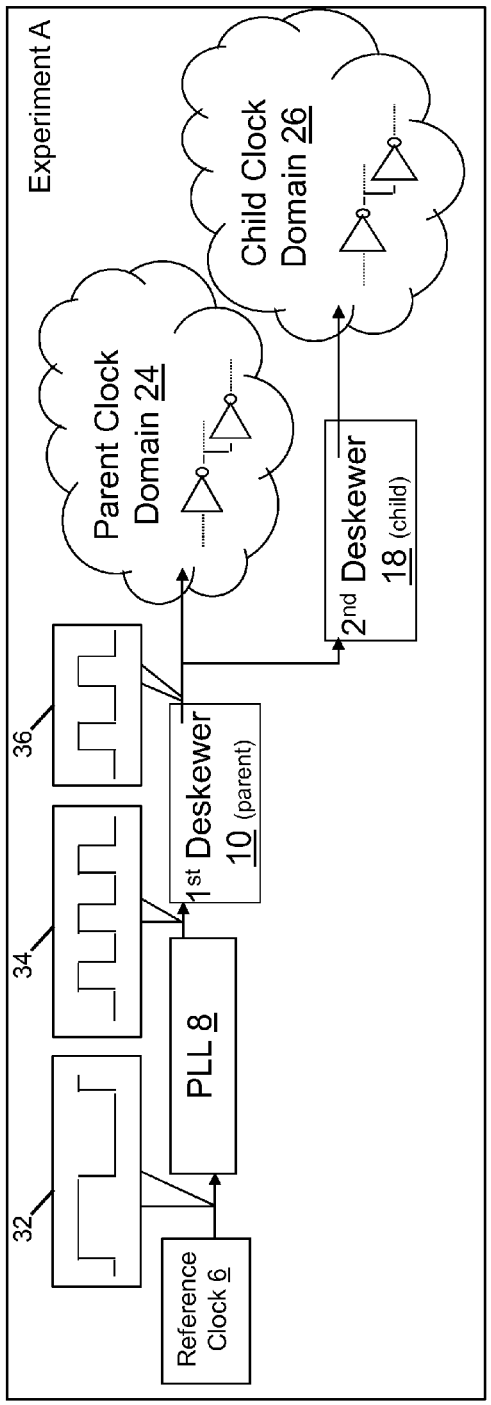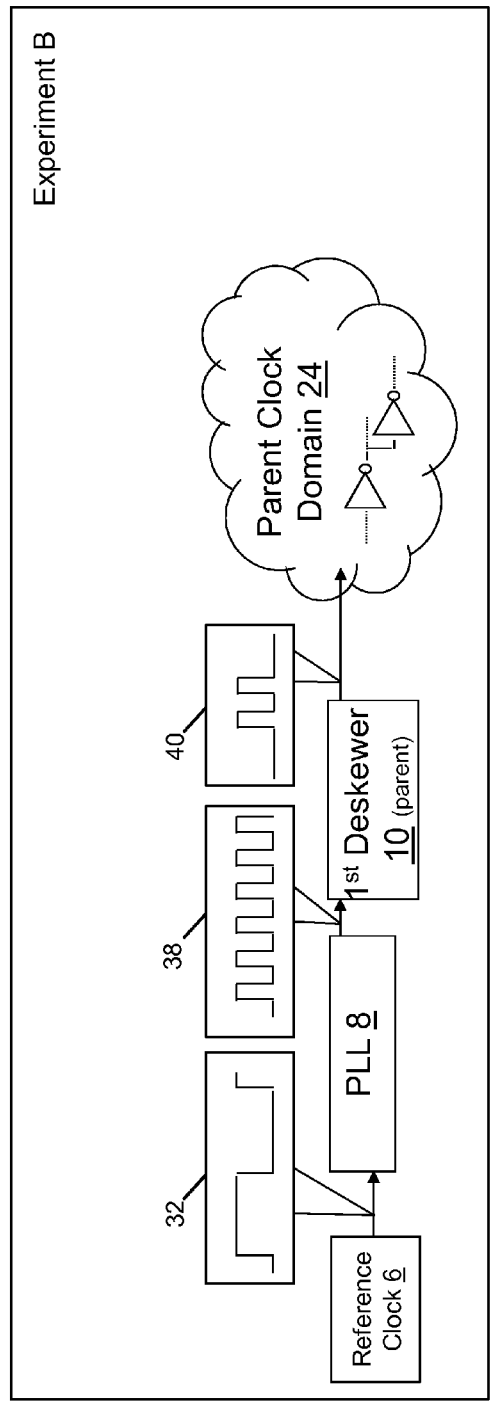
Fig. 2
Fig. 3

METHOD WITH SYSTEM AND PROGRAM PRODUCT FOR PRIORITIZING CLOCK DOMAINS FOR TESTING OF INTEGRATED CIRCUIT DESIGNS

BACKGROUND

Embodiments of the invention relate generally to integrated circuit testing techniques. More specifically, the disclosure relates to a system, method, and program product for prioritizing clock domains used in the testing of integrated circuits.

The growing complexity and proliferation of integrated circuit (IC) chips has increased the demand for quality, cost-effective testing of the circuitry in each chip. Testing can be performed with external equipment and/or self-test circuitry. In the case of an external testing device, testing software may be installed on the external device. One scheme for testing an IC chip is Automatic Test Pattern Generation (ATPG). In ATPG, an "ATPG tool" can generate several test patterns, which are each run on the IC chip or circuit being tested. Each test pattern can be designed to detect the presence of particular errors in addition to unexpected or random errors. The generated test patterns, when applied, cause the circuit to generate an output pattern which can indicate the presence of faults or errors, such as design problems and manufacturing defects.

Some defects in an IC chip, e.g., in-line resistance, high impedance shorts, and cross talk between different signals, can only be identified when the circuitry is running at the intended speed of operation. A testing technique which may be used with ATPG is an "At-Speed Structural Test," (ASST) in which the frequencies of the generated test patterns match the operational frequency of the IC chip. In an ASST, a "fault model" of the circuit representing all possible faults (or errors) may be built in software. The software can allow a user to select various portions, each of which may include several clock domains, of a circuit under test and generate "stimulus patterns" for each section. The faults tested by the software are each "marked off" until reaching a desired percentage of faults. The generated patterns can be "committed" after the desired percentage is reached, and the generated test patterns can be added to a global list stored in memory.

The circuitry of an IC chip may include multiple "parent" and "child" logic sections designed to operate at different frequencies. Some logic sections may be tested serially (one after another) while other logic sections can be tested in parallel. In an ASST, the presence of "parent" and "child" logic can reduce the accuracy and/or increase costs because a simulated clock signal may be limited to one frequency during a single test experiment. As a result, various "parent" and "child" sections of an IC chip may be tested multiple times. In addition or alternatively, parent logic circuits may be "marked off" after being tested below its operating frequency, and thus not tested at the maximum speed. Thus, considerations for testing an IC chip include sequencing the various "portions" of the circuit under test to assure that individual faults are tested at their highest application frequency, and generating the minimum possible number of test patterns, to avoid testing certain portions of the IC chip more than once.

SUMMARY

According to one embodiment of the present invention, a method of prioritizing clock domains for testing an integrated circuit (IC) design is provided. The method can include: assigning each of a plurality of multi-tested clock domains (MTCDs) and a plurality of test experiments (TEs) to one of a plurality of speed priority groups (SPGs), wherein the assigning includes: creating a new SPG having a priority value of n+1, wherein n represents the number of previously created SPGs; assigning a first MTCD corresponding to at least two of the plurality of TEs, the first MTCD not being previously assigned to an SPG, to the new SPG; and assigning each TE corresponding to the first MTCD, each of the assigned TEs not being previously assigned to an SPG, to the new SPG; and performing each of the plurality of TEs on the IC design in order from lowest priority value to highest priority value.

According to another embodiment of the present invention, a program product stored on a computer readable storage medium is disclosed. The program product can be operative to prioritize clock domains for testing an integrated circuit when executed, and the computer readable storage medium can include program code for: assigning each of a plurality of multi-tested clock domains (MTCDs) and a plurality of test experiments (TEs) to one of a plurality of speed priority groups (SPGs), wherein the assigning includes: creating a new SPG having a priority value of n+1, wherein n represents the number of previously created SPGs; assigning a first MTCD corresponding to at least two of the plurality of TEs, the first MTCD not being previously assigned to an SPG, to the new SPG; and assigning each TE corresponding to the first MTCD, the each TE not being previously assigned to an SPG, to the new SPG; and performing each of the plurality of TEs on the IC design in order from lowest priority value to highest priority value.

According to an additional embodiment of the present invention, a system for prioritizing clock domains for testing an integrated circuit is provided. The system can include: a prioritizing component which assigns each of a plurality of multi-tested clock domains (MTCDs) and a plurality of test experiments (TEs) to one of a plurality of speed priority groups (SPGs), wherein the assigning includes: creating a new SPG having a priority value of n+1, wherein n represents the number of previously created SPGs; assigning a first MTCD corresponding to at least two of the plurality of TEs, the first MTCD not being previously assigned to an SPG, to the new SPG; and assigning each TE corresponding to the first MTCD, the each TE not being previously assigned to an SPG, to the new SPG; and a testing component which performs each of the plurality of TEs on the IC design in order from lowest priority value to highest priority value.

BRIEF DESCRIPTION OF THE SEVERAL VIEWS OF THE DRAWINGS

FIGS. 2-3 are block diagrams of two example test experiments according to an embodiment of the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure relate generally to a method, system, and program product for prioritizing clock domains for test pattern generation for an integrated circuit (IC) design. An IC may include several "clock domains." A clock domain generally includes a group of components (e.g., several logic gates, latches, flip flops, etc.) driven by a common clock signal. One "clock domain" may be tested several times during the testing of one IC design. A clock domain used in several test experiments is described herein as a "multi-tested clock domain" (MTCD). A method according to the present disclosure can include assigning each multi-tested clock domain (MTCD) in a group of MTCDs, along with several corresponding test experiments (TE) to any number of speed priority groups (SPGs). The assigning can include creating a new SPG with a priority value of n+1, with "n" representing the number of SPGs that have previously been created. The method also includes choosing one MTCD which is used in at least two of the TEs, but is not already assigned to an SPG, and assigning the chosen MTCD and its corresponding TEs to the new SPG. After one or more SPGs are created, each TE is performed on the IC design, in order from SPG of lowest priority value to SPG of highest priority value. The creation of SPGs in embodiments of the present disclosure can divide the problem of prioritizing each TE for a given IC design into several "sub-problems." For each SPG or "sub-problem," each of the TEs within a given SPG can be prioritized as discussed herein. Further, each group may also be ranked by the frequencies at which each MTCD is tested in each TE. Effects of the present disclosure can thus organize various clock domains into SPGs, and order each SPG such that the highest frequency clock is applied to each domain first, and that the test faults are "marked off" in the ATPG software's global list. Embodiments of the present disclosure can be used before the initial generation of test patterns, which decreases the likelihood of clock domains being tested at less than their highest frequency, and then being "marked off".

Figure 1:
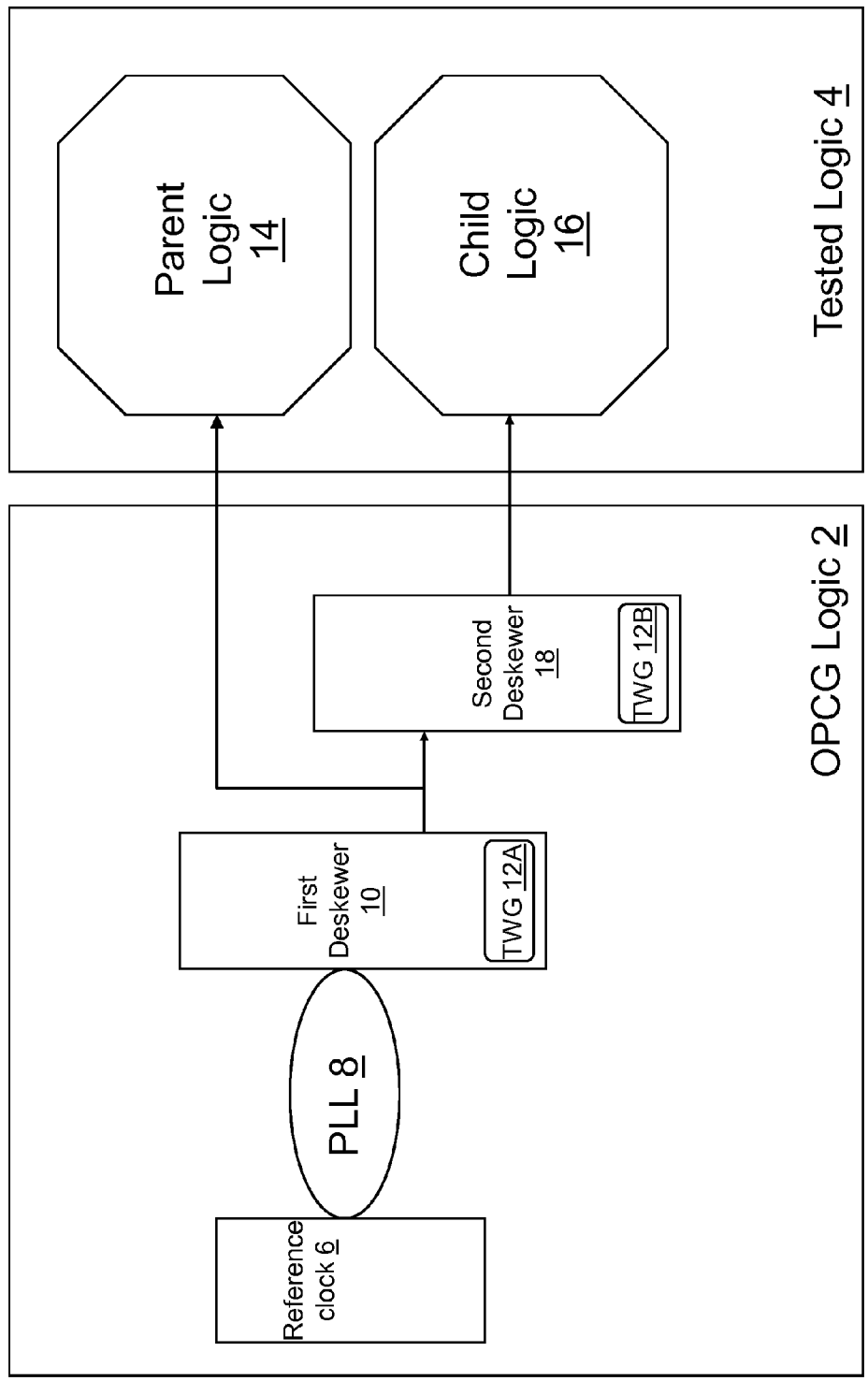
FIG. 1 is a schematic diagram of an IC chip under test according to an embodiment of the invention.

Turning to FIG. 1, an example of several cascaded deskewers of an On Product Clock Generation (OPCG) logic section 2 coupled to tested logic 4 in an IC chip under test is shown. A "deskewer" generally can refer to any component which can accept a clock input and provide a single clock output with a rising and/or falling edge aligned with the input. The clock output of a deskewer can have the same frequency as the clock input, or a lower frequency. The term "on product clock generation" generally can refer to clock generation components included on an IC circuit itself or a product used to test circuitry. As used herein, the term "cascaded" can refer to the use of multiple deskewers simultaneously, where the input signal for the second (or "child") deskewer is driven by a clock output from the first (or "parent") deskewer. An example of a "cascaded" deskewer arrangement is shown by example in FIG. 1. In an at speed structural test (ASST) of an IC design, OPCG logic 2 typically includes a reference clock 6 which simulates a clock signal provided to tested logic 4. Reference clock 6 of OPCG logic 2 may generate a signal with a lower frequency than is provided to tested logic 4 during application. To increase this lower frequency, a phase locked loop 8 (PLL) can multiply the frequency of a signal communicated from reference clock 6. Thus, PLL 8 can allow tested logic 4 to be tested with a clock signal of similar speed to the clock of the finished product. The output of PLL 8 can be coupled to a first deskewer 10, which may include at least one test waveform generator 12A (TWG). TWG 12A can output one or more waveforms or "patterns" which are designed to identify predictable or unpredictable errors within the architecture of tested logic 4 when run thereon. First deskewer 10 can thus allow the patterns generated in TWG 12A to map accurately against the frequency of waveforms yielded from PLL 8 by removing any inconsistency between the timing of each component.

Another function of deskewer 10 can include decreasing the frequency of the clock signal generated in PLL 8. This function may be particularly important when tested logic 4 includes a parent logic circuit 14 ("parent logic") and a child logic circuit 16 ("child logic"). In normal operation, first deskewer 10 can provide a clock signal to parent logic 14 at a frequency higher than that of the output of second deskewer 18. However, this operation generally cannot be performed when reference clock 6, PLL 8, and other components coupled thereto operate in test mode. During a test, the clock signal to parent logic 14 cannot be at a higher frequency than the test clock to second deskewer 18 because of limitations in conventional TWG circuits, such as TWG 12A and TWG 12B.

To avoid this problem, deskewer 10 can operate in a "divide mode," which deskewers the simulated clock from PLL 8 into a lower frequency clock signal provided to both parent logic circuit 14 and child logic circuit 16 (through second deskewer 18). Deskewer 10 in divide mode can decrease the output clock frequency by a finite multiple (e.g., divide the frequency by two or four). The first simulated clock from PLL 8, along with the test pattern generated in TWG 12A, can be delivered to parent logic 14 to run a Test Experiment (TE) on tested logic 4. The simulated clock signal yielded from first deskewer 10 can also be provided to a second deskewer 18, which may contain another TWG 12B. TWG 12B, similar to TWG 12A, can generate a test pattern used in a TE for other portions of tested logic 4 in particular settings. In a "cascaded" configuration, second deskewer 18 may operate in a "pass through mode," in which the output clock signal has the same frequency as the input clock signal, and test patterns generated in TWG 12A can pass through second deskewer 18 to reach child logic 16. Thus, the test waveforms generated in TWG 12A can be substantially coincident with the simulated clock frequency, e.g., by causing the corresponding rising and falling edges of the test pattern and the simulated clock to occur at substantially the same time. As a result, first deskewer 10 and second deskewer 18 can simultaneously test parent logic 14 and child logic 16 of tested logic 4 with test patterns at the same frequency. However, where parent logic 14 operates at a higher frequency than child logic 16, this arrangement may not allow test patterns generated in TWG 12A to test parent logic 14 at the highest possible frequency in a single test.

Referring to FIG. 2 and FIG. 3 together, representations of two TEs, Experiment A (FIG. 2) and Experiment B (FIG. 3) are shown. Experiment A and Experiment B can be performed, for example, using the example of cascaded deskewers shown in FIG. 1. Parent logic 14 of tested logic 4 (FIG. 1) can be defined as a "clock domain," representing a portion of logic driven by a single clock signal. As described elsewhere herein, a clock domain used in at least two TEs is a "multi-tested clock domain" (MTCD). In a given test, e.g., an At Speed Structural Test (ASST), a particular IC design may have several clock domains, as indicated by example in Experiment A. However, as discussed with respect to FIG. 1, a particular clock domain may only be tested at one frequency within a given test experiment where a deskewer (e.g., deskewer 10) operates in divide mode when providing a simulated clock to parent logic 14 (FIG. 1) and child logic 16 (FIG. 1). In addition, the examples shown in FIGS. 2 and 3 are simplified for the purposes of demonstration and clarity; it is understood that a particular parent clock domain may have several corresponding child clock domains, and any given child clock domain can also be associated with several sub-child clock domains, with each sub-child logic having respective children, etc.

Experiment A (as shown in FIG. 2), first deskewer 10 can operate in divide mode while generating a test waveform (e.g., in TWG 12A (FIG. 1)) and a simulated clock for parent clock domain 24 at a particular frequency. The simulated clock can also be provided to child clock domain 26 at the same frequency as parent clock domain 24. This effect is summarized by reference clock pattern 32 at a given frequency increasing to the speed of simulated clock signal 34 after being multiplied in PLL 8. First deskewer 10 can generate a test pattern 36 which corresponds to the frequency of simulated clock 34. Experiment B (as shown in FIG. 3) differs by including only parent clock domain 24 and can be performed without second deskewer 18, allowing PLL 8 and TWG 12A (FIG. 1) to generate a simulated clock and test pattern of a different, higher frequency. Second deskewer 18 may still be electrically coupled to first deskewer 10, but in experiment B may be operating in a "blocked mode," which prevents the output clock from first deskewer 10 from passing through second deskewer 18. Similar to Experiment A, reference clock 6 can generate reference clock pattern 32. With PLL 8, reference clock pattern 32 is multiplied in PLL 8 to become a high frequency simulated clock 38. First deskewer 10, in Experiment B, can operate without dividing high frequency simulated clock 38 because second deskewer 18 is "blocked" and no test patterns for child clock domain 26 are generated. In addition, TWG 12A (FIG. 1) can generate a high frequency test pattern 40 for parent clock domain 24. As a result, Experiment B can allow higher frequency logic circuits to be tested due to the absence of child clock domain 26.

The characteristics of different experiments, e.g., Experiment A and Experiment B, can influence the order in which various portions of an IC design are tested. To increase the speed and decrease the costs of testing, some TEs can be performed in parallel. However, Experiment A and Experiment B as shown would not be conducted in parallel because parent clock domain 24 has a different frequency in each experiment. Many forms of structural testing software also include a "mark off" feature, in which logic circuits are marked as tested after a test waveform is generated and run on the logic circuit. For the experiments shown in FIG. 2, this "mark off" feature would cause parent clock domain 24 to be "marked off" as tested following Experiment A. By marking both parent clock domain 24 and child clock domain 26 as being tested following Experiment A, structural testing software or another testing device normally would not conduct Experiment B and therefore prevent parent logic 14 (FIG. 1) from being tested at its highest frequency. However, the alternative of disabling the "mark off" feature would cause several duplicitous TEs to be conducted on clock domains which have previously been tested.

Figure 4:
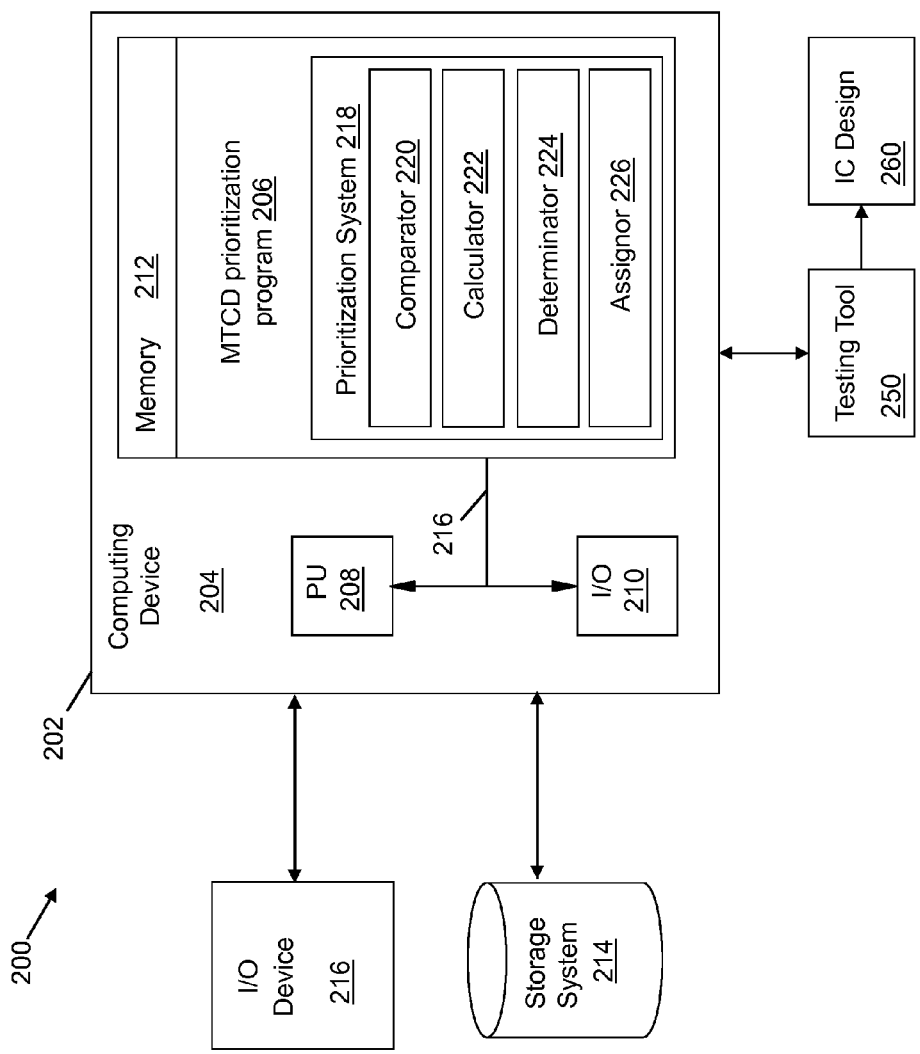
FIG. 4 is an example computer system for prioritizing clock domains used to test an integrated circuit according to an embodiment of the invention.

Turning to FIG. 4, an environment 200 which can be used for prioritizing clock domains used to generate test patterns for an integrated circuit (IC) design is shown. For example, environment 200 and the components discussed herein can organize several experiments, e.g., Experiment A and Experiment B of FIG. 2, into several "speed priority groups" (SPGs). The assigning of MTCDs and TEs to various SPGs creates an order of testing logic circuits in which the "mark off" feature of the testing software can remain enabled, while allowing as many experiments to run in parallel as possible, and avoiding the testing of a logic circuit at less than its highest frequency. In particular, a computer system 202 is shown as including a computer device 204. Computer device 204 can include MTCD prioritization program 206, which can create and prioritize SPGs by performing any/all of the processes described herein and implementing any/all of the embodiments described herein.

Computer system 202 is shown including a processing unit 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 can execute program code, such as the MTCD prioritization program 206, which is at least partially fixed in memory 212. While executing program code, processing unit 208 can process data, which can result in reading and/or writing transformed data from/to memory 212 and/or I/O device 216 for further processing. Pathway 218 provides a communications link between each of the components in the computer system 202. I/O component 210 can comprise one or more human I/O devices, which enable a human user to interact with computer system 202 and/or one or more communications devices to enable a system user to communicate with the computer system 202 using any type of communications link. To this extent, MTCD prioritization program 206 can manage a set of interfaces (e.g., graphical user interface(s), application program interface, etc.) that enable human and/or system users to interact with MTCD prioritization program 206. Further, MTCD prioritization program 206 can manage (e.g., store, retrieve, create, manipulate, organize, present, etc.) data, through several modules contained within a prioritization system 218.

In any event, computer system 202 can comprise one or more general purpose computing articles of manufacture (e.g., computing devices 204) capable of executing program code, such as MTCD prioritization program 206, installed thereon. As used herein, it is understood that "program code" means any collection of instructions, in any language, code, or notation, that cause a computing device having an information processing capability to perform a particular function either directly or after any combination of the following: (a) conversion to another language, code or notation; (b) reproduction in a different material form; and/or (c) decompression. To this extent, MTCD prioritization program 206 can be embodied as any combination of system software and/or application software.

Further, MTCD prioritization program 206 can be implemented using a prioritization system 218. In this case, various modules of prioritization system 218 can enable computer system 202 to perform a set of tasks used by MTCD prioritization program 206, and can be separately developed and/or implemented apart from other portions of MTCD prioritization program 206. As used herein, the term "component"

means any configuration of hardware, with or without software, which implements the functionality described in conjunction therewith using any solution, while the term "module" means program code that enables computer system 202 to implement the functionality described in conjunction therewith using any solution. When fixed in memory 212 of computer system 204 which includes processing unit 208, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of computer system 204.

Several modules of prioritization system 218 are shown in FIG. 4 by way of example. A comparator module 220 can compare two or more data quantities, a calculator 222 can perform mathematical operations, a determinator 224 can take actions and/or make decisions based on data in memory 212 and/or storage system 214, and an assignor 226 can group several items of data together as defined by a process flow. The ordering of tests provided with MTCD prioritization program 206 can be communicated to a testing tool 250, e.g., an automatic test pattern generation (ATPG) tool. Testing tool 250 can be used to generate test patterns and run tests, e.g., at-speed structural tests, on an IC design 260. As ATPG tool operates, information regarding the testing and "marking off" of various logic circuits can be communicated back to computer system 202 as desired. As described elsewhere herein, MTCD prioritization program 206 can generate an order of running TEs on various MTCDs with a fast and economical solution.

Where computer system 202 comprises multiple computing devices, each computing device may have only a portion of MTCD prioritization program 206 fixed thereon (e.g., one or more modules). However, it is understood that computer system 202 and MTCD prioritization program 206 are only representative of various possible equivalent computer systems that may perform a process described herein. To this extent, in other embodiments, the functionality provided by computer system 202 and MTCD prioritization program 206 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 202 includes multiple computing devices, the computing devices can communicate over any type of communications link. Further, while performing a process described herein, computer system 202 can communicate with one or more other computer systems using any type of communications link. In either case, the communications link can comprise any combination of various types of wired and/or wireless links; comprise any combination of one or more types of networks; and/or use any combination of various types of transmission techniques and protocols. Computer system 202 can obtain or provide data, such as data stored in storage system 212, using any solution. For example, computer system 202 can generate and/or be used to generate data from one or more data stores, receive data from another system, send data to another system, etc.

While shown and described herein as a method and system for grouping and prioritizing various MTCDs and TEs to generate test patterns for an IC design, it is understood that aspects of the invention further provide various alternative embodiments. For example, in one embodiment, the invention provides a computer program fixed in at least one computer-readable medium, which when executed, enables a computer system to prioritize clock domains for testing an IC design. To this extent, the computer-readable medium includes program code, such as MTCD prioritization program 206, which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as MTCD prioritization program 206, which implements some or all of the processes described herein. In this case, a computer system can process a copy of program code that implements some or all of the processes described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for prioritizing clock domains for generating test patterns for an IC design. In this case, a computer system, such as computer system 202, can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

Figure 5:
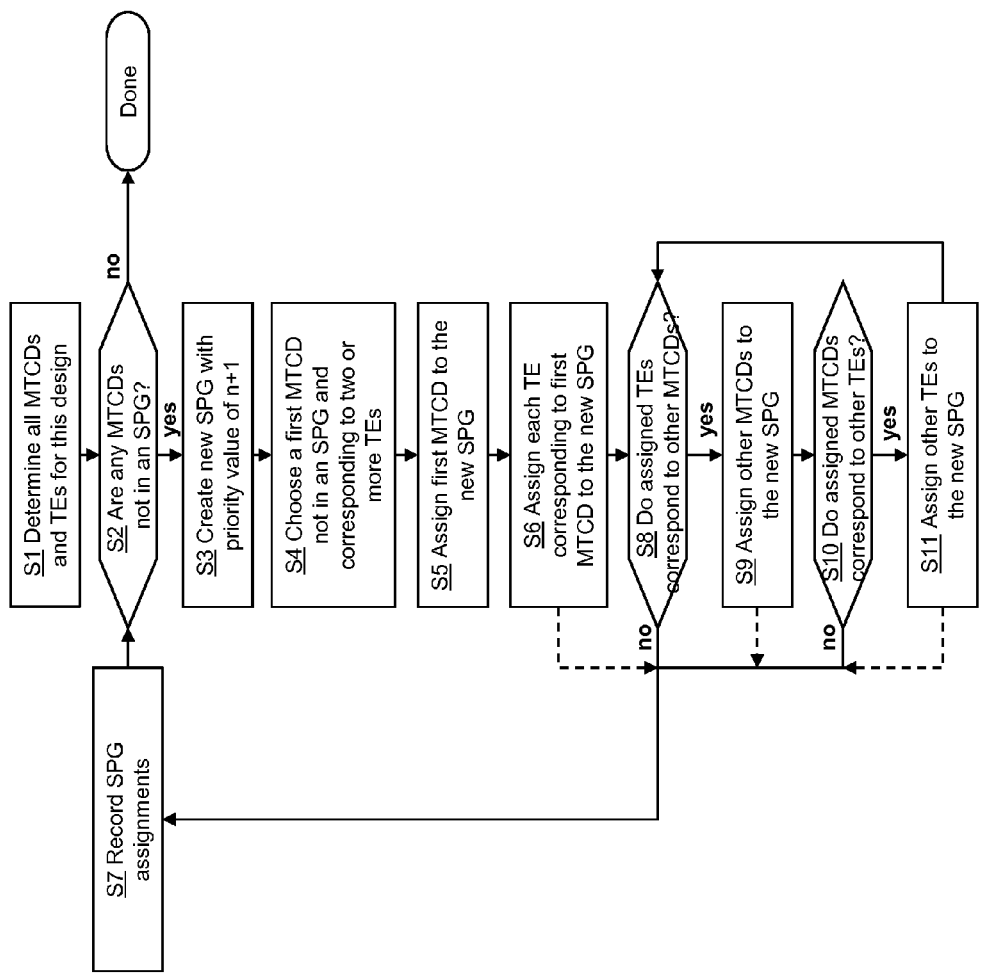
FIG. 5 is an example flow diagram of a method according to an embodiment of the invention.

Referring to FIG. 4 and FIG. 5 together, an example process flow diagram of a method for prioritizing clock domains for generating test patterns for an integrated circuit (IC) design is shown. As described herein, the total test time and related costs for testing an IC design can be decreased by performing some TEs in parallel while performing other TEs sequentially, "marking off" various logic circuits after each test is performed, and doing so in an order which allows each clock domain to be tested at its highest possible frequency. Embodiments of the various methods discussed can generate an order of testing for, e.g., an at speed structural test, which maximizes the number of parallel tests while ensuring that tested logic has been tested at its highest frequency when "marked off".

Methods according to the present disclosure are described by example herein as being carried out with computing system 202 of FIG. 4, though the disclosed methods can also be performed with any device currently known or later developed. In step S1 of the method, determinator 224 of computing system 202 can determine each MTCD and test experiment used during a test of IC design 260. Determinator 224 of prioritization system 218 can then determine in step S2 whether any MTCDs have not been assigned to a particular SPG. Initially, step S2 can result in finding one or more MTCDs which have not been assigned to an SPG. Following the identification of each MTCD in step S2, prioritization system 218, in step S3, can create a new SPG with a priority value of "n+1," where n is equal to the number of SPGs that have previously been created. As an example, the first SPG can have a priority value of "1" because "n" is equal to zero because of no SPGs having been previously created. As discussed herein, the "priority value" of each SPG can generally correspond to a number of prioritized sub groups, or an order in which testing tool 250 is instructed to perform groups of TEs and/or generate test patterns for various MTCDs. Initially, the newly created SPG may have no MTCDs or TEs assigned to it. In step S34, prioritization system 218 can choose a "first MTCD" to add to the newly created SPG. The chosen MTCD may correspond to the highest frequency TEs if desired, but choosing the highest frequency TEs is not necessary in each embodiment of the methods described herein. In step S5, assignor 226 can assign the chosen "first MTCD" to the new SPG. In step S6, prioritization system 218 can assign each TE in which the first MTCD is used to the new SPG. As an example, where the first MTCD is used in three separate TEs, with each TE also being run on several other MTCDs, each of the three separate TEs "corresponds" to the first MTCD. The three "corresponding" TEs are thus added to the new SPG in step S6.

In an embodiment, prioritization system 218 can record the assignments in step S7 (e.g., to memory 212 and/or storage system 214) by following the process flow shown in phantom from step S6 after assigning each corresponding TE to the new SPG. Determinator 224 can then repeat step S2 to determine whether more MTCDs have not been assigned to the SPG, if desired. Alternatively, the method can include additional steps for assigning additional MTCDs and TEs related to the first MTCD to the same SPG, after each TE corresponding to the first MTCD have been assigned in step S6. As shown in FIG. 5, the steps described herein can be performed in a loop until all corresponding MTCDs and TEs are assigned to the new SPG. Determinator 224 in step S8 can determine whether the TEs assigned to the new SPG correspond to other MTCDs not assigned to an SPG. For example, determinator 224 can identify whether a given TE generates test patterns for the first MTCD in parallel with one or more MTCDs. Assignor 226 can then add these other MTCDs to the new SPG in step S9. In the event that no other MTCDs are identified in step S8, prioritization system 218 can continue to step S7 to record the assignment of each MTCD and TE to the new SPG. In an alternative embodiment, prioritization system 218 can also record the SPG assignments in step S7 via the phantom process flow from step S9 without performing other steps discussed herein.

Prioritization system 218 can also determine whether the assigned other MTCDs correspond to other TEs not assigned to an SPG in step S10. If all TEs associated with the other MTCDs have previously been assigned to an SPG, prioritization system 218 can return to step S7 to record the previous assignments. However, where determinator 224 determines that other TEs correspond to the other MTCDs assigned in step S9, assignor 226 can also assign these other TEs to the new SPG in step S11. In an embodiment, prioritization system 218 can then proceed to step S7 along the phantom process flow from step S11. In other embodiments, prioritization system 218 can return to step S8 to determine whether the assigned other TEs correspond to yet more MTCDs not assigned to an SPG. As shown in FIG. 5, the various processes shown in steps S8-S11 can be repeated in a loop as many times as is desired. As a result, the "first MTCD" first added in step S4 can effectively function as a "stem," from which corresponding or "branching" TEs and MTCDs can be added to the same SPG.

Following the assigning of each identified MTCD and TE in steps S4-S6 and S8-11, prioritization system 218 in step S7 can store each identified TE, MTCD, and their associated frequencies, e.g., in memory 212 and/or storage system 214. After each item of data pertaining to the new SPG is stored, determinator 224 of prioritization system 218 can again examine in step S2 whether other MTCDs to be tested with testing tool 250 remain unassigned to an SPG. Where no other MTCDs are unassigned to an SPG, the method can complete or continue to other processes, e.g., assigning relative priority values, described elsewhere herein. Alternatively, where other MTCDs have not been assigned to an SPG, prioritization system 218 can proceed to step S3 to create a new SPG, and steps S4-11 for assigning MTCDs and TEs to the new SPG can repeat. Thus, embodiments of the method disclosed herein can create one or more SPGs, with each of the various MTCDs, TEs, and frequencies used to test IC design 260 being assigned to at least one of the SPGs.

Following the creation of each SPG and the assigning of each MTCD, TE, and their associated frequencies, the method can include performing each TE on IC design 260 in order, from SPG of lowest priority value to SPG of highest priority value. If desired, the TEs associated with each MTCD can also be prioritized to create an order in which each TE is performed within each SPG. These additional steps can reduce the risk of clock domains being "marked off" before being tested at their highest frequencies. The example method shown in FIG. 6 illustrates various processes by which TEs corresponding to each MTCD can be assigned relative priority values according to embodiments of the disclosure.

Figure 6:
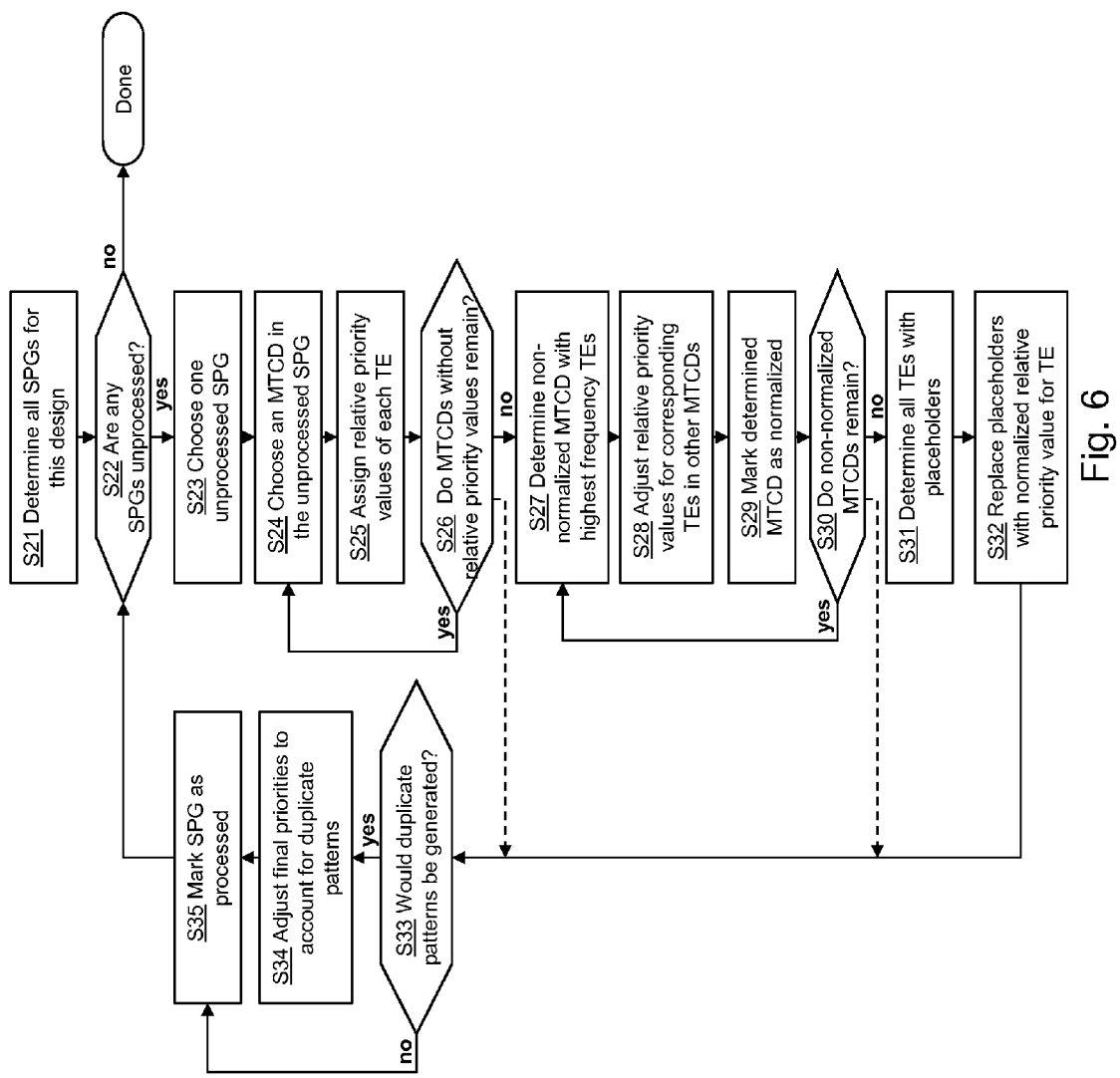
FIG. 6 is another example flow diagram of a method according to an embodiment of the invention.

Considering FIG. 4 and FIG. 6 together, determinator 224 of prioritization system 218 in step S21 can determine each SPG associated with IC design 260 and/or used in a particular test. Determinator 224 can then examine in step S22 whether any of the SPGs for the design (e.g., SPGs resulting from the method shown in FIG. 5) have not yet been "processed." As described herein, the term "processed" refers to setting relative priority values for each TE in an SPG, which may be specific to one MTCD, or may be normalized across the entire SPG as described herein. In the event that at least one SPG remains to be processed, prioritization system 218 in step S23 can choose one an SPG to process. The order in which each SPG is processed is immaterial to the methods described herein, as relative priority values distinguish only between MTCDs and TEs within the same SPG. Thus, the SPG chosen in step S23 can be obtained through any desired method, including choosing an SPG at random.

In step S24, determinator 224 of prioritization system 218 can choose an MTCD of the SPG corresponding to TEs without relative priority values. In step S25, comparator 220 and calculator 222 can evaluate the frequency of each TE performed at least partially on the chosen MTCD, and assign relative priority values for each TE from highest frequency to lowest frequency. For example, where the chosen MTCD is used in three different TEs, assignor 226 would assign a relative priority value of "one" for the highest frequency TE, a relative priority value of "two" for the next highest frequency TE, and a relative priority value of "three" for the lowest frequency TE. In the event the chosen MTCD is missing from a given TE, the relative priority value of the TE for the chosen MTCD can be marked with a placeholder, (e.g., "DONT_CARE") in lieu of a relative priority value. Determinator 224 can then determine whether other MTCDs in the unprocessed SPG have not been assigned relative priority values for each of corresponding TEs in step S26. In the event that MTCDs without relative priority values for their TEs remain, prioritization system 218 can repeat steps S24 and S25 as many times as desired. Otherwise, prioritization system 218 can proceed to other steps such as the normalization steps discussed herein. Prioritization system 218 can also proceed to step S33 (discussed elsewhere herein) along the phantom process flow from step S26 in embodiments which do not include further processing steps described herein.

To further improve the testing of IC design 260, the relative priority values of each TE within in the chosen SPG can be "normalized." The process of "normalizing" or "normalization," as used herein, refers to a mathematical operation in which the relative priority values of each TE corresponding to each MTCD are renumbered to reflect their frequency relative to other TEs in the same SPG. The normalization steps shown in FIG. 6 and discussed herein can allow prioritization system 218 to determine whether a given TE can be performed on several MTCDs in parallel, or whether test patterns should be generated at all for an MTCD during a given TE. To begin normalizing each MTCD, the method can proceed to step S27 after determinator 224 determines in step S26 that each TE corresponding to an MTCD has been assigned a relative priority value. In step S27, prioritization system 218 can determine which of the non-normalized MTCDs in the SPG corresponds to the highest frequency TEs. If the highest frequency occurs within TEs performed on several MTCDs, determinator 224 can choose one non-normalized MTCD at random or arbitrarily. In step S28, comparator 220 can compare the relative priority values of each TE associated with the MTCD determined in S27 with the relative priority value of these TEs for other MTCDs. In addition, assignor 226 can adjust the relative priority value of each TE in the other MTCDs during step S28 to account for determined MTCD being tested at a higher frequency. In step S29, the MTCD determined in step S27 can then be marked as "normalized" because the relative priority values for its test experiments have priority over the relative priority values of TEs performed on the other MTCDs in the SPG. In step S30, determinator 224 can determine whether other MTCDs in the SPG have not been normalized. In the event that non-normalized MTCDs remain in the SPG, prioritization system 218 can return to S27 and determine which non-normalized MTCD includes the highest frequency TEs. Steps S27-S30 can then repeat as often as desired until determinator 224 determines in step S30 that all MTCDs in the SPG have been normalized. After each MTCD in the chosen SPGs has been normalized, prioritization system 218 can proceed to further steps discussed herein to account for any placeholder values. Alternatively, prioritization system 218 can proceed to step S33 (discussed elsewhere herein) along the process flow shown in phantom from step S30 in embodiments where placeholders do not exist or are not accounted for.

Following the normalization of all relative priority values for each MTCD in the current SPG, prioritization system 218 can "audit" each of the normalized MTCDs in step S31 to examine whether any TEs marked with a placeholder (e.g. "DONT_CARE") still exist. First, determinator 224 in step S31 can determine which TEs retain placeholder relative priority values. Assignor 226 in step S32 can then replace any placeholder relative priority values for a TE with the normalized relative priority value for the TE determined in step S28. Following the steps described herein, several TEs may share the same relative priority value. Reappearing priority values suggest that an experiment can be performed on several MTCDs in parallel. Thus, relative priority values do not necessarily need to be adjusted by virtue of appearing in several MTCDs.

Once relative priority values are assigned for each TE, determinator 224 of prioritization system 218 in step S33 can determine whether duplicate test patterns would be generated when testing the SPG. For example, even after processing a given SPG, the same test patterns may be generated in two different TEs. In the event that determiner 224 determines that duplicate patterns would be generated, assignor 226 can replace the highest relative priority value of the duplicate pattern or patterns with the lowest relative priority value for the same pattern in step S34. If no duplicate patterns will be generated, prioritization system 218 can bypass step S34. Following the steps described herein, prioritization system 218 can mark the SPG as "processed" in step S35. Prioritization system 218 can then repeat step S22, in which determinator 224 can determine whether other SPGs have been processed. In the event that other unprocessed SPGs remain, the processing steps described herein can be repeated as desired. After all SPGs have been processed, the method can complete. Computer system 202 can then communicate to testing tool 250 a prioritized order of carrying out each TE with respect to the relative priority value and normalization of each MTCD for each SPG. Specifically, testing tool 250 can perform each TE in order from lowest priority value SPG to highest priority value SPG, and from lowest relative priority value to highest relative priority value within each SPG. Thus, embodiments of the present disclosure can allow each MTCD and each TE within each SPG to be prioritized quickly and cost-effectively.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method of prioritizing clock domains for testing an integrated circuit (IC) design, the method comprising:
  assigning each of a plurality of multi-tested clock domains (MTCDs) and a plurality of test experiments (TEs) to one of a plurality of speed priority groups (SPGs) each having a respective priority value of at least one, wherein the assigning includes:
    creating a new SPG having a priority value of n+1, wherein n represents a number of previously created SPGs;

assigning a first MTCD corresponding to at least two of the plurality of TEs, the first MTCD not being previously assigned to an SPG, to the new SPG; and assigning each TE corresponding to the first MTCD, each of the assigned TEs not being previously assigned to an SPG, to the new SPG; and performing each of the plurality of TEs on the IC design in order of SPG priority value from each TE in one of the plurality of SPGs having a priority value of one to each TE in one of the plurality of SPGs having a highest priority value, a last-created one of the plurality of SPGs having the highest SPG priority value.

2. The method of claim 1, wherein the assigning further includes: assigning each of a plurality of second MTCDs corresponding to each of the assigned TEs and not previously assigned to any of the previously created SPGs, to the new SPG.

3. The method of claim 2, wherein the assigning further includes assigning a plurality of additional TEs corresponding to each of the plurality of second MTCDs and not assigned to any of the previously created SPGs to the new SPG.

4. The method of claim 1, further comprising:
performing each of the plurality of TEs within one of the SPGs on the IC design in order from a lowest relative priority value within the SPG to a highest relative priority value within the SPG;

wherein the assigning further includes setting the relative priority value of each TE for each MTCD in the new SPG.

5. The method of claim 4, wherein the setting of the relative priority value of each TE further includes ordering each TE corresponding to one of the plurality of MTCDs from highest frequency to lowest frequency.

6. The method of claim 5, further comprising generating a normalized order of all TEs within the SPG.

7. The method of claim 6, wherein the generating of the normalized order includes assigning a relative priority value of a missing TE not included in one of the plurality of MTCDs with the relative priority value of the missing TE in another of the plurality of MTCDs.

8. A program product stored on a computer readable storage medium, the program product operative to prioritize clock domains for testing an integrated circuit when executed, the computer readable storage medium comprising program code for:

assigning each of a plurality of multi-tested clock domains (MTCDs) and a plurality of test experiments (TEs) to one of a plurality of speed priority groups (SPGs) each having a respective priority value of at least one, wherein the assigning includes:

creating a new SPG having a priority value of n+1, wherein n represents a number of previously created SPGs;

assigning a first MTCD corresponding to at least two of the plurality of TEs, the first MTCD not being previously assigned to an SPG, to the new SPG; and assigning each TE corresponding to the first MTCD, each of the assigned TEs not being previously assigned to an SPG, to the new SPG; and performing each of the plurality of TEs on the IC design in order of SPG priority value from each TE in one of the plurality of SPGs having a priority value of one to each TE in one of the plurality of SPGs having a highest priority value, a last-created one of the plurality of SPGs having the highest SPG priority value.

9. The program product of claim 8, wherein the program code for assigning further includes: assigning each of a plurality of second MTCDs corresponding to each of the assigned TEs and not previously assigned to any of the previously created SPGs to the new SPG.

10. The program product of claim 9, wherein the program code for assigning further includes assigning a plurality of additional TEs corresponding to each of the plurality of second MTCDs and not assigned to any of the previously created SPGs to the new SPG.

11. The program product of claim 8, further comprising program code for:

performing each of the plurality of TEs on the IC design within one of the SPGs in an order from a lowest relative priority value within the SPG to a highest relative priority value within the SPG;

wherein the assigning further includes setting the relative priority value of each TE for each MTCD in the new SPG.

12. The program product of claim 11, wherein the program code for setting the relative priority value of each TE further includes ordering each TE corresponding to one of the plurality of MTCDs from highest frequency to lowest frequency.

13. The program product of claim 12, further comprising program code for generating a normalized order of all TEs within the SPG.

14. A system for prioritizing clock domains for testing an integrated circuit, the system comprising:

a prioritizing component which assigns each of a plurality of multi-tested clock domains (MTCDs) and a plurality of test experiments (TEs) to one of a plurality of speed priority groups (SPGs) each having a respective priority value of at least one, wherein the assigning includes:

creating a new SPG having a priority value of n+1, wherein n represents a number of previously created SPGs;

assigning a first MTCD corresponding to at least two of the plurality of TEs, the first MTCD not being previously assigned to an SPG, to the new SPG; and assigning each TE corresponding to the first MTCD, the each TE not being previously assigned to an SPG, to the new SPG; and a testing component which performs each of the plurality of TEs on the IC design in order of SPG priority value from each TE in one of the plurality of SPGs having a priority value of one to each TE in one of the plurality of SPGs having a highest priority value, a last-created one of the plurality of SPGs having the highest SPG priority value.

15. The system of claim 14, wherein the prioritizing component further assigns each of a plurality of second MTCDs corresponding to each of the assigned TEs and not previously assigned to any of the previously created SPGs to the new SPG.

16. The system of claim 15, wherein the prioritizing component further assigns a plurality of additional TEs corresponding to each of the plurality of second MTCDs and not assigned to any of the previously created SPGs, to the new SPG.

17. The system of claim 14, wherein the testing component further performs, on the IC design, each of the plurality of TEs within one of the SPGs in order from a lowest relative priority value within the SPG to a highest relative priority value within the SPG; and wherein the prioritizing component further assigns the relative priority value of each TE for each MTCD in the new SPG.

18. The system of claim 17, wherein the prioritizing component further sets the relative priority value of each TE further includes ordering each TE corresponding to one of the plurality of MTCDs from highest frequency to lowest frequency.

19. The system of claim 18, wherein the prioritizing component further sets a normalized order of all TEs within the SPG.

20. The system of claim 19, wherein prioritizing component sets the normalized order by assigning a relative priority value of a missing TE not included in one of the plurality of MTCDs with the relative priority value of the missing TE in another of the plurality of MTCDs.

* * * * *